United States Patent
Kassayan (10) Patent No.: US 9,910,094 B2
(45) Date of Patent: Mar. 6, 2018

(54) SYSTEM AND METHOD FOR IMPROVING CHEMICAL EFFICIENCY OF A BATTERY IN A FLOW MEASUREMENT SYSTEM

(71) Applicant: Aquacue, Inc., Los Gatos, CA (US)

(72) Inventor: Reza Kassayan, Atherton, CA (US)

(73) Assignee: Badger Meter, Inc., Milwaukee, WI (US)

( * ) Notice: Subject to any disclaimer, the term of this patent is extended or adjusted under 35 U.S.C. 154(b) by 975 days.

(21) Appl. No.: 13/682,654

(22) Filed: Nov. 20, 2012

(65) Prior Publication Data

US 2014/0139229 A1    May 22, 2014

(51) Int. Cl.
| | |
|---|---|
| H02J 7/00 | (2006.01) |
| G08B 23/00 | (2006.01) |
| G08C 15/06 | (2006.01) |
| G01R 31/36 | (2006.01) |
| H04W 4/00 | (2018.01) |
| H02J 7/34 | (2006.01) |
| H04W 84/18 | (2009.01) |

(52) U.S. Cl.
CPC ........ *G01R 31/3606* (2013.01); *H02J 7/0054* (2013.01); *H02J 7/34* (2013.01); *H04W 4/005* (2013.01); *H04Q 2209/88* (2013.01); *H04Q 2209/883* (2013.01); *H04W 84/18* (2013.01); *Y10T 307/625* (2015.04)

(58) Field of Classification Search
CPC .............. H02J 7/0054; H04Q 2209/88; H04Q 2209/883; H04W 4/005; H04W 84/18
USPC .......................................................... 320/103
See application file for complete search history.

(56) References Cited

U.S. PATENT DOCUMENTS

| | | | | |
|---|---|---|---|---|
| 4,914,393 A | * | 4/1990 | Yoshido ............. | G01R 31/3648 320/DIG. 21 |
| 5,272,475 A | * | 12/1993 | Eaton ....................... | G08B 6/00 320/155 |
| 5,631,503 A | * | 5/1997 | Cioffi .................... | H02J 7/0013 307/43 |
| 5,841,284 A | * | 11/1998 | Takahashi ............ | G01R 31/361 324/427 |
| 6,182,497 B1 | | 2/2001 | Krajci | |
| 2001/0026142 A1 | * | 10/2001 | Furukawa ............. | B60W 10/26 320/103 |
| 2005/0206530 A1 | * | 9/2005 | Cumming .............. | G01D 4/006 340/870.02 |

(Continued)

FOREIGN PATENT DOCUMENTS

| | | |
|---|---|---|
| CA | 2380945 A1 | 10/2003 |
| JP | H11069643 | 3/1999 |
| JP | 2002365116 A  * | 12/2002 |

*Primary Examiner* — David V Henze-Gongola
(74) *Attorney, Agent, or Firm* — Boyle Fredrickson, S.C.

(57) ABSTRACT

Systems and methods for powering a measurement system are provided. In some aspects, a system includes a high energy density electric cell, storing energy for powering the measurement system; a rechargeable electric cell, being charged by the high energy density electric cell and providing high current bursts to the measurement system; and a charging control device, coupled between the high energy density electric cell and the rechargeable electric cell, and enabling the high energy density electric cell to charge the rechargeable electric cell. The high energy density electric cell operates at a current which allows the high energy density electric cell to be in its optimal zone of chemical efficiency.

33 Claims, 10 Drawing Sheets

(56) References Cited

U.S. PATENT DOCUMENTS

| | | | |
|---|---|---|---|
| 2008/0058995 A1* | 3/2008 | Holindrake | A01G 25/16 700/284 |
| 2009/0164174 A1 | 6/2009 | Bears et al. | |
| 2011/0043043 A1 | 2/2011 | Anupindi et al. | |
| 2011/0215769 A1 | 9/2011 | Huang | |

* cited by examiner

SYSTEM AND METHOD FOR IMPROVING CHEMICAL EFFICIENCY OF A BATTERY IN A FLOW MEASUREMENT SYSTEM

BACKGROUND

The subject technology generally relates to flow measurement systems, and more particularly to power supplies in flow measurement systems.

Figure 1:
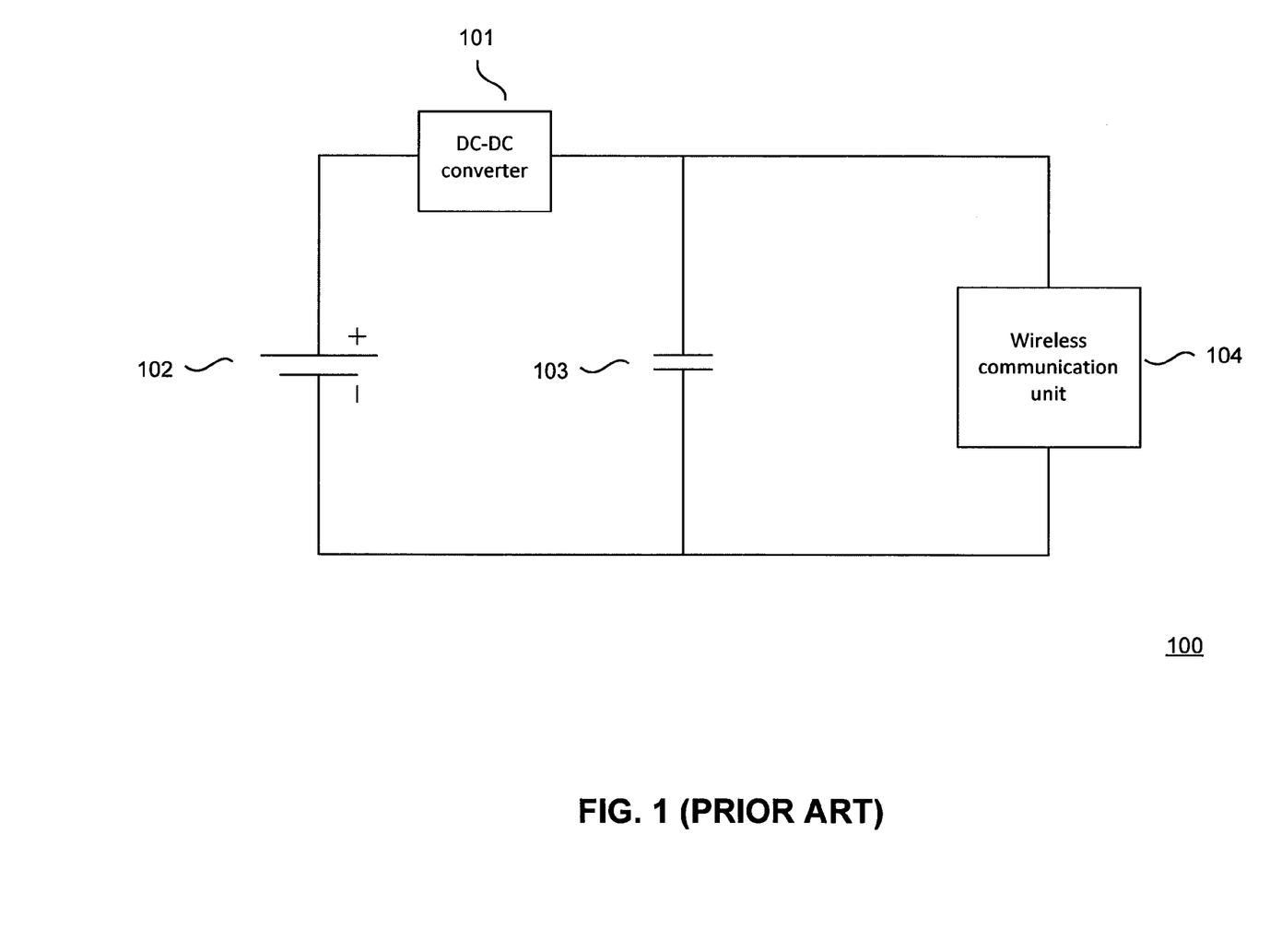
FIG. 1 illustrates a block diagram of a prior art power supply system.

When designing a battery operated device, battery life is usually considered to be mainly dependent on battery capacity and average current consumption. When designing a battery operated device to be operated for an extended period of time, another parameter to consider is battery self-discharge rate. Current consumption may vary significantly in some battery operated devices and their power supplies need to meet the varying power demand as well. FIG. 1 illustrates a block diagram of a prior art power supply system 100 for a battery operated device with varying current consumption, which uses a capacitor as a temporary storage. As shown, an input of a DC-DC converter 101 is coupled to one end of a battery 102. A capacitor 103 and a wireless communication unit 104 are coupled in parallel between an output of the DC-DC converter 101 and the other end of the battery 102. The battery 102 charges the capacitor 103 so that the capacitor 103 can supplement the current to the wireless communication unit 104 when the wireless communication starts.

SUMMARY

The disclosed subject matter relates to a method for powering a measurement system. The method includes comparing a voltage of a rechargeable electric cell with a first threshold, wherein the rechargeable electric cell provides high current bursts to the measurement system; and when the voltage of the rechargeable electric cell is lower than the first threshold, turning on an enabling signal to enable charging of the rechargeable electric cell by a high energy density electric cell which stores energy for powering the measurement system. The high energy density electric cell operates at a current which allows the high energy density electric cell to be in its optimal zone of chemical efficiency.

The disclosed subject matter relates to a power supply system for a measurement system that includes: a high energy density electric cell, storing energy for powering the measurement system; a rechargeable electric cell, being charged by the high energy density electric cell and providing high current bursts to the measurement system; and a charging control device, coupled between the high energy density electric cell and the rechargeable electric cell, and enabling the high energy density electric cell to charge the rechargeable electric cell. The high energy density electric cell operates at a current which allows the high energy density electric cell to be in its optimal zone of chemical efficiency.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced without these specific details. In some instances, well-known structures and components are shown in block diagram form in order to avoid obscuring the concepts of the subject technology.

An example of a system with varying current consumption is a wireless flow measurement system, i.e., a flow measurement system equipped with a wireless communication unit. Flow measurement systems tend to be very low power consuming (e.g., in the range of tens of micro amperes), while wireless communication may demand very high bursts of current (e.g., in the range of several amperes), so the order of magnitude difference in power demand between the flow measurement portion and the wireless portion of the system may be six or more. Wireless communication also drains variable average current, depending on the antenna condition and signal strength. Thus, it is desirable that a power supply system for the wireless flow measurement system is capable of handling high burst currents, keeps quiescence current very low, maintains very high efficiency over wide current demand range, has enough capacity to power the wireless flow measurement system for an extended period of time, and has a low self-discharge rate.

Batteries have different chemistries and their specifications vary widely. Some battery chemistries are ideal for operation for an extended period of time, while others are suitable for high burst applications. An example of batteries intended for operation over an extended period of time is primary (disposable) lithium batteries, which have high energy density and low self-discharge rate. An example of batteries intended for high burst applications is lithium-ion batteries, which can supply a significant amount of current in a fairly short period of time, but have higher self-discharge rate.

For a wireless flow measurement system, current consumption can vary from a few microamperes to several amperes, and wireless peak power demands can happen in several millisecond intervals. For a typical primary lithium battery designed for a few microampere operation, draining more current may result in substantial reduction in total available power. For a system with widely varying current consumption, this may significantly reduce battery life or even permanently damage the battery and make the flow measurement system inoperable. Considering the very tight voltage requirements of wireless systems and unavailability of main battery energy for fast delivery, if the prior art power supply system 100 is used, the capacitor 103 needs to store enough energy for several seconds of wireless transmission. This may amount to hundreds of millifarads capacitor requirement, and the capacitor 103 can be significantly expensive and large. Examples of capacitors commonly used for this type of application are electrolytic capacitors or super capacitors, which are bulky. In addition, the capacitor leakage current may amount to several milliamperes and this may shorten the battery life. Another disadvantage is the short life of electrolytic capacitors or super capacitors. Their function degrades over time and may make the wireless flow measurement system inoperable after a few thousand hours of operation. A further disadvantage is the capacitor's negative impact on the operative temperature range of the wireless flow measurement system. Electrolytic capacitors lose their functionality over extended temperature range and super capacitors are usually not available in a reasonable temperature grade. Due to these practical limitations, no industrial grade device has been able to take advantage of high density batteries for a wide varying current consumption wireless flow measurement system.

Figure 2:
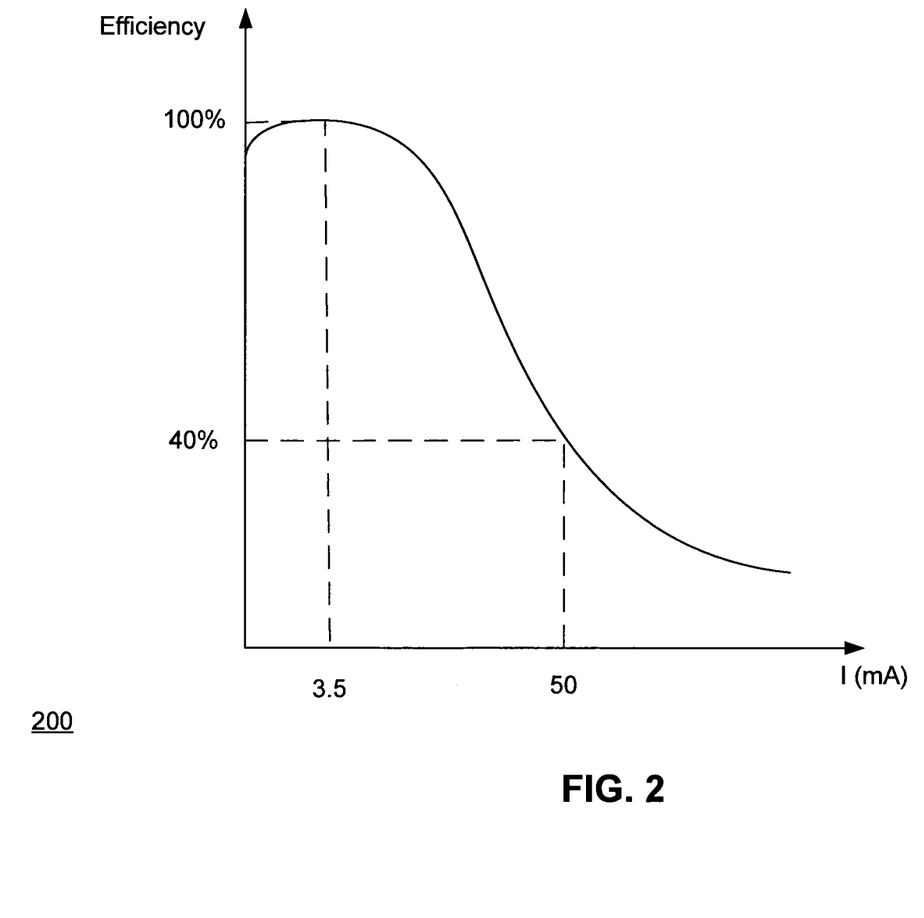
FIG. 2 shows an exemplary relationship between operating current and chemical efficiency for a battery.

Regardless of battery chemistry type, each battery has an optimal zone of operation. The chemical efficiency is the highest when the battery operates in the optimal zone, and battery capacity is usually rated when the battery operates in the optimal zone. A battery usually is designed for this optimal zone and deviation from the optimal zone may cause inefficient chemical reactions, reduce total available power and shorten the battery life. The reduction in battery chemical efficiency specifically is prominent for batteries designed to have high energy density and intended to operate for an extended period of time. FIG. 2 shows an exemplary relationship between the operating current and actual capacity of a battery. As shown, the battery's optimal zone of operation for this example battery is when it operates at a current around 3.5 mA. In the optimal zone, the battery is the most efficient and may almost reach 100% of its rated capacity, e.g., 8.5 ampere/hour. However, if the battery operates at a current out of the optimal zone, e.g., 50 mA, the battery is not efficient and may only reach about 40% of its rated capacity, e.g., 3.4 ampere/hour.

More and more users and utility companies monitor water, gas or electricity usage via wireless measurement systems, and usage data may be collected wirelessly. However, since the wireless measurement systems are battery operated but there has been no technology which can take advantage of high density batteries for a wide varying current consumption wireless measurement system. Embodiments of the present invention provide a power supply system for a wireless flow measurement system. The power supply system has high capacity and ultra-low self-discharge current, and at the same time is capable of handling high power burst requirements. The power supply system may have an accumulator battery serving as a main energy storage, an intermediate battery serving as a temporary energy storage, and a charger coupled between the accumulator battery and the intermediate battery. The accumulator battery may be a high energy density battery and provide enough capacity to the wireless flow measurement system for operation over an extended period of time. The intermediate battery may be a lower energy density rechargeable battery and capable of providing high current bursts. The charger may be tuned to operate at a fixed current that is in the optimal zone of chemical efficiency for the accumulator battery. The charger may enable the accumulator battery to charge the intermediate battery, thus exchanging energy between the accumulator battery and the intermediate battery (which are different chemistry batteries) at optimal zones, maximizing chemical efficiency for the batteries, and preventing power loss.

Figure 3:
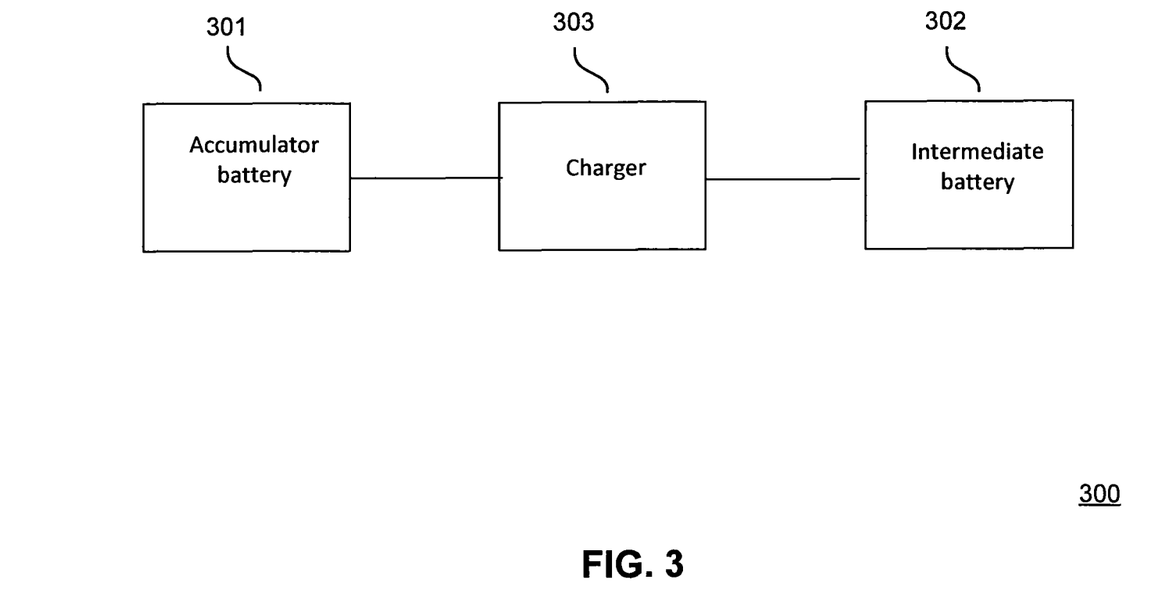
FIG. 3 illustrates a block diagram of a power supply system according to one embodiment of the present invention.

FIG. 3 illustrates a block diagram of a power supply system 300 according to one embodiment of the present invention. As shown, the power supply system 300 may have an accumulator battery 301, an intermediate battery 302 and a charger 303 coupling the accumulator battery 301 to the intermediate battery 302.

The accumulator battery 301 may work as the main storage of the power supply system 300. The accumulator battery 301 may be a high capacity and high energy density battery, rechargeable or non-rechargeable, and may provide enough power to a wireless flow measurement system for operation over an extended period of time. In one embodiment, the accumulator battery 301 may be a lithium battery. It should be understood that other high capacity, high energy density batteries may be used as the accumulator battery 301.

The intermediate battery 302 may work as a temporary storage of the power supply system 300 and be used to power up high burst current stages, e.g., a wireless communication unit. The selection of the intermediate battery 302 is important for maximizing the energy transfer from the accumulator battery 301 to the intermediate battery 302.

The intermediate battery 302 should be capable of delivering high burst currents and storing enough energy for at least one complete cycle of wireless transmission, so as to meet the wireless peak power demands of a wireless flow measurement system.

The intermediate battery 302 should have a low self-discharge current, or rate, to prevent power loss. Due to the nature of their chemistry, high burst current capable batteries usually have higher self-discharge currents than other batteries at equivalent capacity. But this may be mitigated by using a high burst current capable battery with a smaller capacity (e.g., only enough for one or few wireless transmissions). A small capacity battery may scale self-discharge current down by several orders of magnitude and eliminate adverse effect of high burst currents on battery life. In one embodiment, instead of using a battery which can power 50000 radio communication sessions, a battery which can power only 5 radio communication sessions may be used as the intermediate battery 302. On one hand, the energy is kept in the accumulator battery 301, the intermediate battery 302 may be charged by the accumulator battery 301, and the power supply system 300 may power a wireless flow measurement system to operate for an extended period of time. On the other hand, since the capacity of the intermediate battery 302 is 1000 times smaller, the leakage may be about 1000 times smaller too.

Thus, it is desirable that the intermediate battery 302 is a lower density rechargeable battery, having a low self-discharge current and being high burst current capable at the same time. One example of batteries which may be used as the intermediate battery 302 is LiFeSo4 batteries. The intermediate battery 302 may also be lithium polymer ("Lipoly", "Li-Pol", "LiPo", "LIP", "PLI" or "LiP") batteries, nickel-cadmium ("NiCAD") batteries, nickel metal hybrid ("NiMH" or "Ni-MH") batteries or other rechargeable high burst capable batteries.

The accumulator battery 301 and the intermediate battery 302 may be replaceable. In one example, the batteries may be selected to power a wireless flow measurement system for ten or twenty years before being replaced.

The charger 303 may enable the accumulator battery 301 to charge the intermediate battery 302 when necessary. As a result, the intermediate battery 302 may be able to power a wireless flow measurement system for an extended period of time, although the intermediate battery 302 itself has a small capacity. In one embodiment, the charger 303 may monitor a voltage of the intermediate battery 302 and enable charging of the intermediate battery 302 as soon as the voltage of the intermediate battery 302 drops below a first preset value. The accumulator battery 301 may continue to charge the intermediate batter 302 until the voltage of the intermediate battery 302 reaches a second preset value. The charger 303 may operate in a closed loop and another cycle of charging may start as soon as the voltage of the intermediate battery 302 drops below the first preset value.

The charger 303 may be tuned to operate at a fixed current that is in the optimal zone of chemical efficiency for the accumulator battery 301. The fixed current may be, e.g., around 3.5 mA. The intermediate battery 302 may absorb the variation caused by the wireless flow measurement system without significantly compromising performance and may work at, e.g., sub 1 mA average current drain. Since the accumulator battery 301 only works in its optimal zone, it may reach its maximum capacity.

The charger 303 transfers energy from the accumulator battery 301 to the intermediate battery 302 and may be more than 97% efficient. Even though a few percentage points of energy may be lost in this process, huge amount of energy may be saved by preventing the batteries to operate in inefficient zones.

Figure 4:
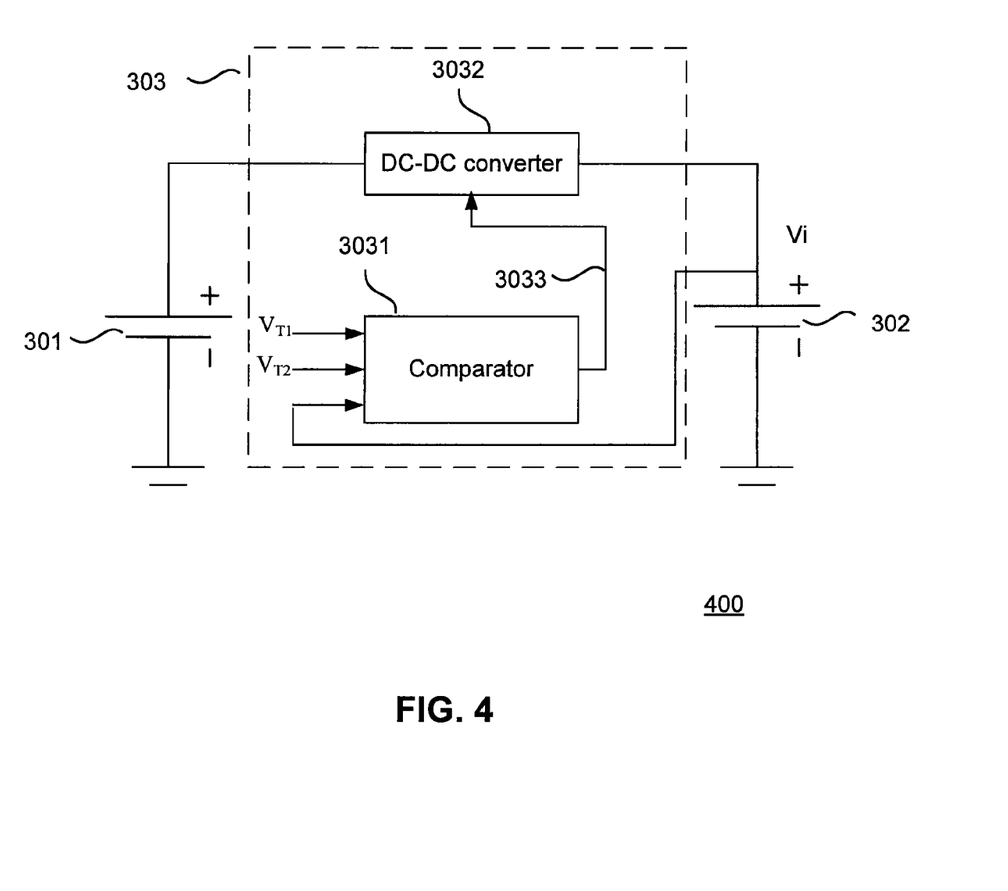
FIG. 4 illustrates a block diagram of a power supply system according to one embodiment of the present invention.

FIG. 4 illustrates an example of a charger 303 according to one embodiment of the present invention. As shown, the charger 303 may have a comparator 3031 and a DC-DC converter 3032. The DC-DC converter 3032 may be coupled between the accumulator battery 301 and the intermediate battery 302. A first input of the comparator 3031 may be coupled to a first preset voltage $V_{T1}$, a second input of the comparator 3031 may be coupled to a second preset voltage $V_{T2}$, and a third input of the comparator 3031 may be coupled to the intermediate battery 302 to receive a voltage Vi of the intermediate battery 302. The output of the comparator 3031 may be coupled to the DC-DC converter 3032 via line 3033 and provide an enabling signal EN to enable the accumulator battery 301 to charge the intermediate battery 302. Although a DC-DC converter is shown and described, it should be understood that other voltage regulators may be used, e.g., a low-dropout regulator ("LDO").

Figure 5:
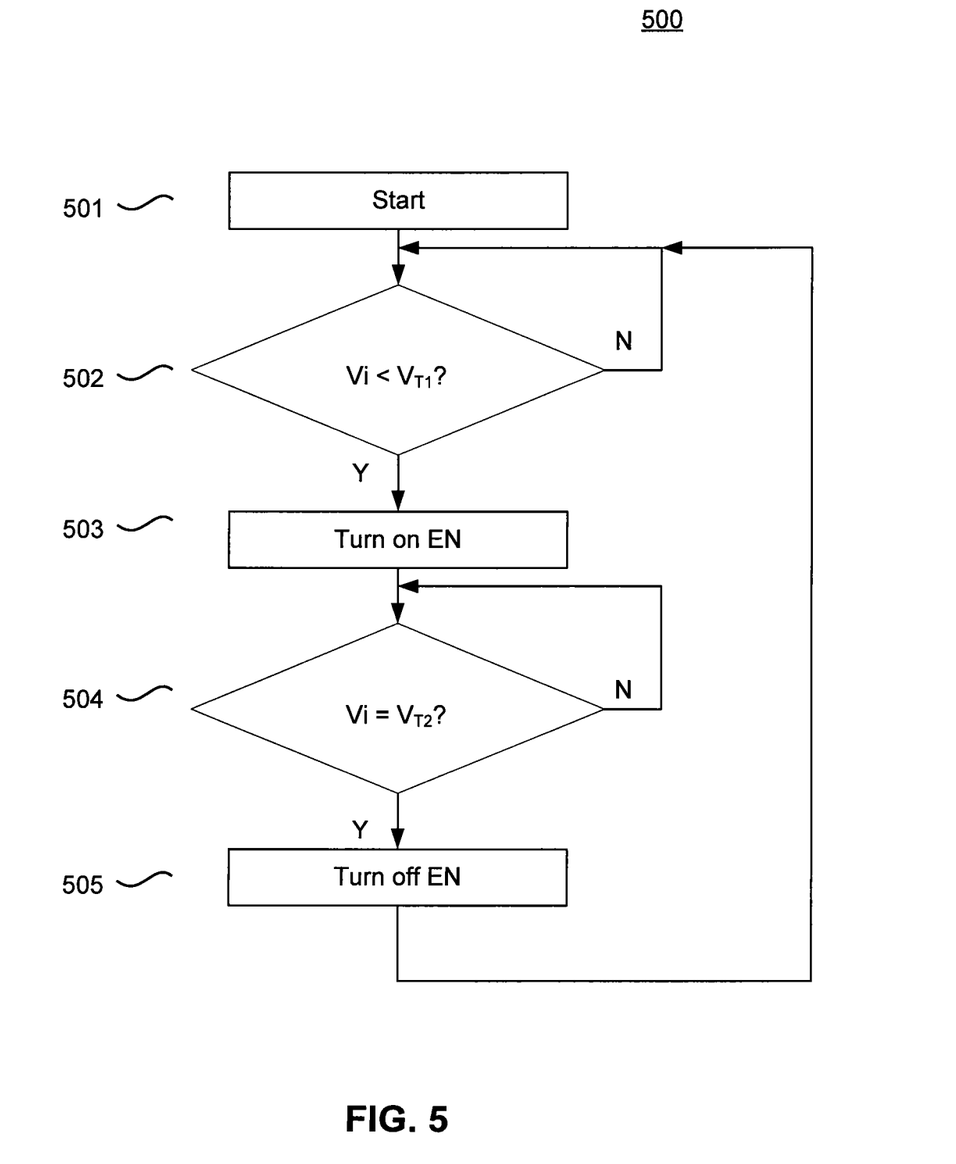
FIG. 5 illustrates an exemplary operation process of a charger according to one embodiment of the present invention.
Figure 6:
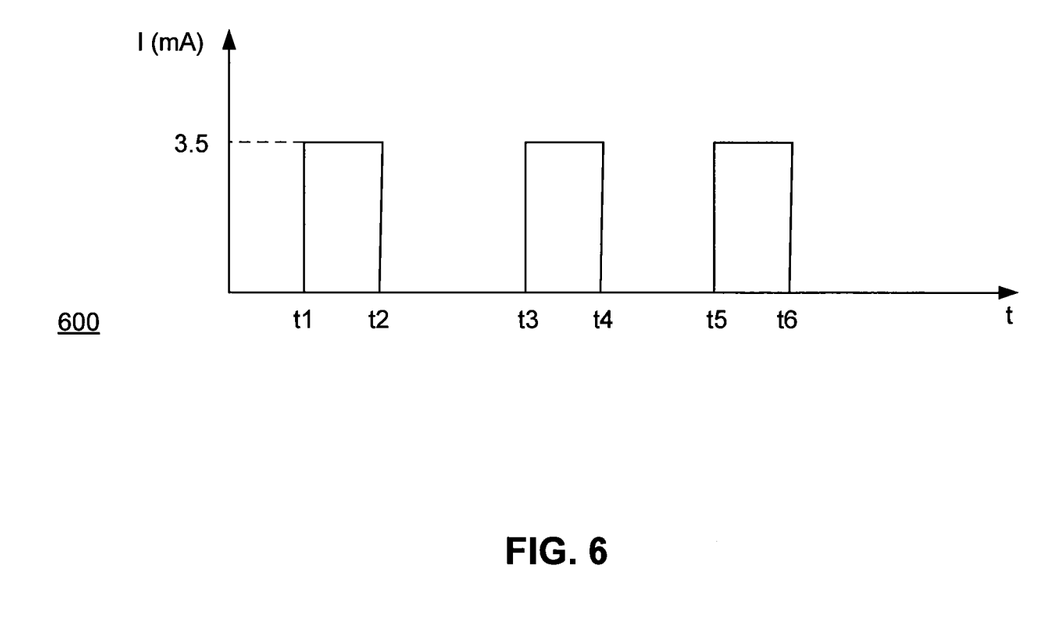
FIG. 6 illustrates an exemplary waveform of an enabling signal EN according to one embodiment of the present invention.

FIG. 5 illustrates an exemplary operation process 500 of the charger 303 according to one embodiment of the present invention, and FIG. 6 illustrates an exemplary waveform of the enabling signal EN. The process may start at 501. At 502, the comparator 3031 may compare the voltage Vi of the intermediate battery 302, received via a positive feedback from the intermediate battery 302, with the first preset voltage $V_{T1}$. If the voltage Vi of the intermediate battery 302 drops below the first preset voltage $V_{T1}$ at t1 (as shown in FIG. 6), the comparator 3031 may turn on the enabling signal EN to the DC-DC converter 3032 at 503, so that the accumulator battery 301 may start to charge the intermediate batter 302. At 504, the comparator 3031 may compare the voltage Vi of the intermediate batter 302 and the second preset voltage $V_{T2}$. If the voltage Vi of the intermediate battery exceeds the second preset voltage $V_{T2}$ at t2 (as shown in FIG. 6), the comparator 3031 may turn off the enabling signal EN to the DC-DC converter 3032 at 505, so that the charging stops. The process may then repeat 502-505, and the intermediate battery 302 may be charged from t3-t4 and from t5 to t6, as shown in FIG. 6.

The first and second preset voltage $V_{T1}$ and $V_{T2}$ may be selected to make sure that the intermediate battery 302 has enough energy for at least one complete cycle of wireless transmission. In one embodiment, the first preset voltage $V_{T1}$ may be, e.g., 3.05-3.24 V, and the second preset voltage $V_{T2}$ may be, e.g., 3.25 to 3.37 V. The values of the first and second preset voltage $V_{T1}$ and $V_{T2}$ may be selected based on the batteries and may be other values as well.

Figure 7:
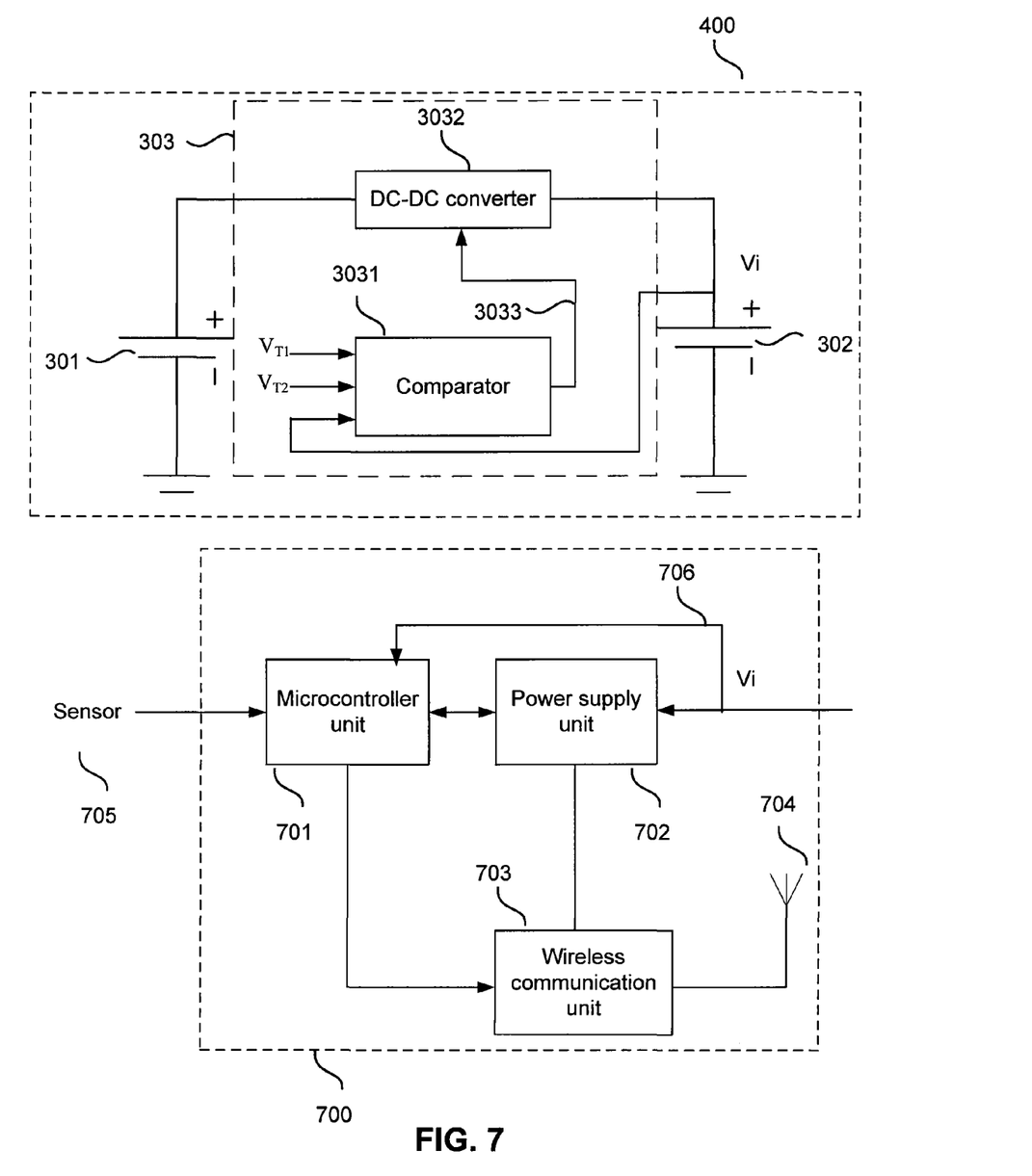
FIG. 7 illustrates a block diagram of an exemplary wireless flow measurement system powered by a power supply system according to one embodiment of the present invention.

FIG. 7 illustrates a block diagram of an exemplary wireless flow measurement system 700 powered by the power supply system 400 according to one embodiment of the present invention. The wireless flow measurement system 700 may include a microcontroller unit 701, a power supply unit 702, a wireless communication unit 703 and an antenna 704.

The microcontroller unit 701 may be coupled to a sensor 705. The sensor 705 may have a magnet module which may comprise any number of magnets and sensors for detecting changes in magnetic field and/or current of a water meter. The magnets may comprise any magnetic material. In some embodiments, the sensor 705 may detect changes in the magnetic field of the water meter and generate water usage data reflecting water usage.

The microcontroller unit 701 may read the water usage data from the sensor 705, and push the water usage data to the wireless communication unit 703 so that the water usage data may be broadcasted via the antenna 704. In one embodiment, the microcontroller unit 701 may sleep after pushing the water usage data to the wireless communication unit 703, and wake up after a predetermined period of time to read the water usage data from the sensor 705 again.

The microcontroller unit 701 may be configured to control the wireless flow measurement system 700. In various embodiments, the microcontroller unit 701 may receive commands wirelessly to automatically provide any available water usage data, turn off the water, identify the wireless flow measurement system 700, troubleshoot the wireless flow measurement system 700, or deactivate the wireless flow measurement system 700. In some embodiments, commands may be sent remotely by a qualified professional (such as an employee of the utility monitoring the water usage). In some embodiments, one or more commands may be provided by a user. The microcontroller unit 701 may receive commands remotely or locally (e.g., manually).

In one embodiment, the microcontroller unit 701 may also be configured to receive the voltage Vi of the intermediate battery 302 via 706. The microcontroller unit 701 may monitor the voltage Vi, calculate power remaining in the intermediate battery and determine to selectively turn off certain portions in the wireless flow measurement system 700 based on the value of Vi. In one embodiment, the microcontroller unit 701 may determine to turn off the wireless communication unit 703 if the microcontroller unit 701 detects that a long broadcast is coming but Vi indicates that the intermediate battery 302 does not have enough power for the long broadcast. The microcontroller unit 701 may determine to restart the wireless communication unit 703 when Vi indicates that the intermediate battery 302 has enough power for the long broadcast. The microcontroller unit 701 may send control signals to the power supply unit 702 which may then turn off or restart the wireless communication unit 703.

The power supply unit 702 may be coupled to the intermediate battery 302, convert the battery power to what is required by various parts in the wireless flow measurement system 700 (e.g., the microcontroller unit 701 and the wireless communication unit 703), and provide the converted power to these parts. For example, the wireless communication unit 703 may have very tight limitation on what voltage it can tolerate. To be more power efficient, the power supply unit 702 may turn off power to some parts of the wireless flow measurement system 700 under certain conditions according to control signals from the microcontroller unit 701. In one embodiment, the power supply unit 702 may turn off power to the wireless communication unit 703 when the microcontroller unit 701 determines that there is no wireless broadcast for a certain period of time.

The wireless communication unit 703 may be configured to send water usage data over a wireless communication network through the antenna 704. In one embodiment, the wireless communication unit 703 may transmit water usage data at predetermined time intervals, e.g., every five minutes. In various embodiments, the wireless communication unit 703 may comprise a cellular based communication module (e.g., GSM or CDMA wireless communication device).

The wireless flow measurement system may comprise more, less or functionally equivalent components.

The wireless flow measurement system 700 may be used to measure, e.g., usage of water or gas. It should be understood that the power supply system 400 may be used to power other systems which are intended to operate for an extended period of time and at the same time require high current bursts, e.g., a wireless measurement system for measuring usage of electricity.

Figure 8:
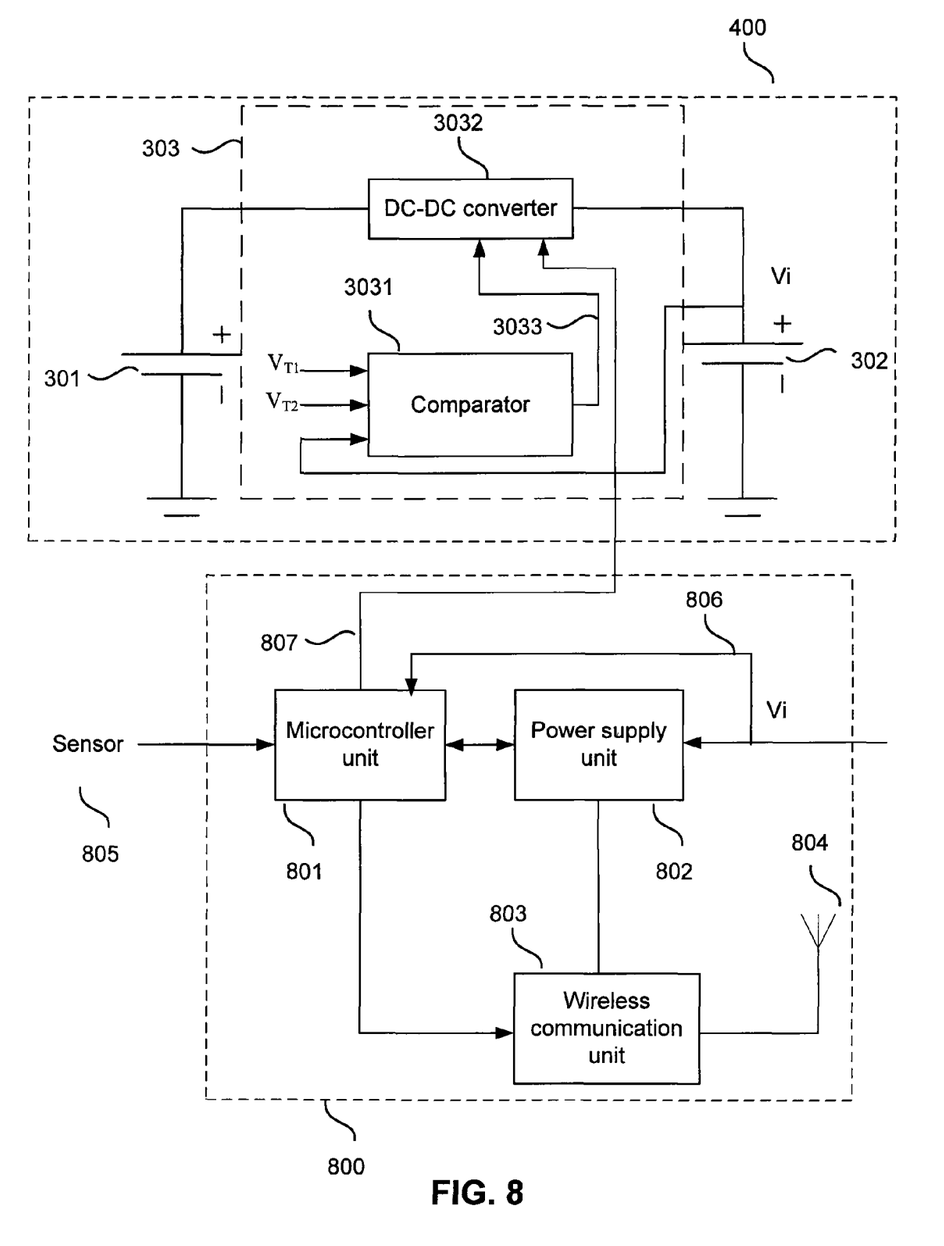
FIG. 8 illustrates a block diagram of an exemplary wireless flow measurement system powered by a power supply system according to one embodiment of the present invention.

FIG. 8 illustrates a block diagram of an exemplary wireless flow measurement system 800 powered by the power supply system 400 according to one embodiment of the present invention. Similar to the wireless flow measurement system 700 shown in FIG. 7, the wireless flow measurement system 800 may have a microcontroller unit 801, a power supply unit 802, a wireless communication unit 803 and an antenna 804. The microcontroller unit 801 may be coupled to a sensor 805 to receive water usage data, and monitor the voltage Vi via 806. The power supply unit 802 may be coupled to the intermediate battery 302, and provide battery power to various parts in the wireless flow measurement system 800 (e.g., the microcontroller unit 801 and the wireless communication unit 803). The wireless communication unit 803 may be configured to send water usage data over a wireless communication network through the antenna 804.

One difference between the wireless flow measurement system 800 and 700 is that the microcontroller unit 801 may send a triggering signal 807 to the charger 303. As discussed above, the intermediate battery 302 should not have too much capacity, otherwise the leakage current of the intermediate battery 302 may be significant. In one embodiment, to make sure that the intermediate battery 302 has enough energy for the operation of the wireless flow measurement system 800, the microcontroller unit 801 may monitor the voltage Vi of the intermediate battery 302 via 806.

If the microcontroller unit 801 determines that there is a long wireless broadcast coming, the voltage Vi of the intermediate battery 302 is above the first preset voltage $V_{T1}$ but the voltage Vi indicates that the intermediate battery 302 does not have enough energy for the long wireless broadcast, the microcontroller unit 801 may send the triggering signal 807 to the charger 303 to trigger charging the intermediate battery 302, before the voltage Vi falls below the first preset voltage $V_{T1}$. In one embodiment, the triggering signal 807 may be sent to the DC-DC converter 3032 in the charger 303 in the power supply system 400. Instead of using a preset value as the threshold for turning on the triggering signal 807, the microcontroller unit 801 may dynamically compare the power remaining in the intermediate battery 302 and power needed for a wireless broadcast, and turn on the triggering signal 807 when the power remaining is not enough for the wireless broadcast.

Accordingly, the charging of the intermediate battery 302 may be started under two circumstances. First, the comparator 3031 may compare the voltage Vi of the intermediate battery 302 with the first preset voltage $V_{T1}$. When the voltage Vi of the intermediate battery 302 falls below the first preset voltage $V_{T1}$, the comparator 3031 may send an enabling signal EN to the DC-DC converter 3032 to enable charging of the intermediate battery 302 by the accumulator battery 301, until the voltage Vi of the intermediate battery 302 reaches the second preset voltage $V_{T2}$. Second, the microcontroller unit 801 may monitor the voltage Vi of the intermediate battery 302 via 806 at the same time, and send a triggering signal 807 to the charger 303 to trigger charging of the intermediate battery 302 before the voltage Vi falls below the first preset voltage $V_{T1}$. For example, even when the voltage Vi of the intermediate battery 302 is above the first preset voltage $V_{T1}$ and the comparator 3031 is not sending the enabling signal EN to the DC-DC converter 3032, if the microcontroller unit 801 anticipates that a long wireless broadcast will start soon and the intermediate battery 302 needs to store more energy to prepare for the broadcast, the microcontroller unit 801 may send a triggering signal 807 to the DC-DC converter 3032 to trigger charging the intermediate battery 3032.

It should be understood that, in addition to the triggering signal 807 from the microcontroller 801, the charger 303 may be slightly tunable to also allow fine tuning of the charge current according to ambient temperature or other parameters.

Figure 9:
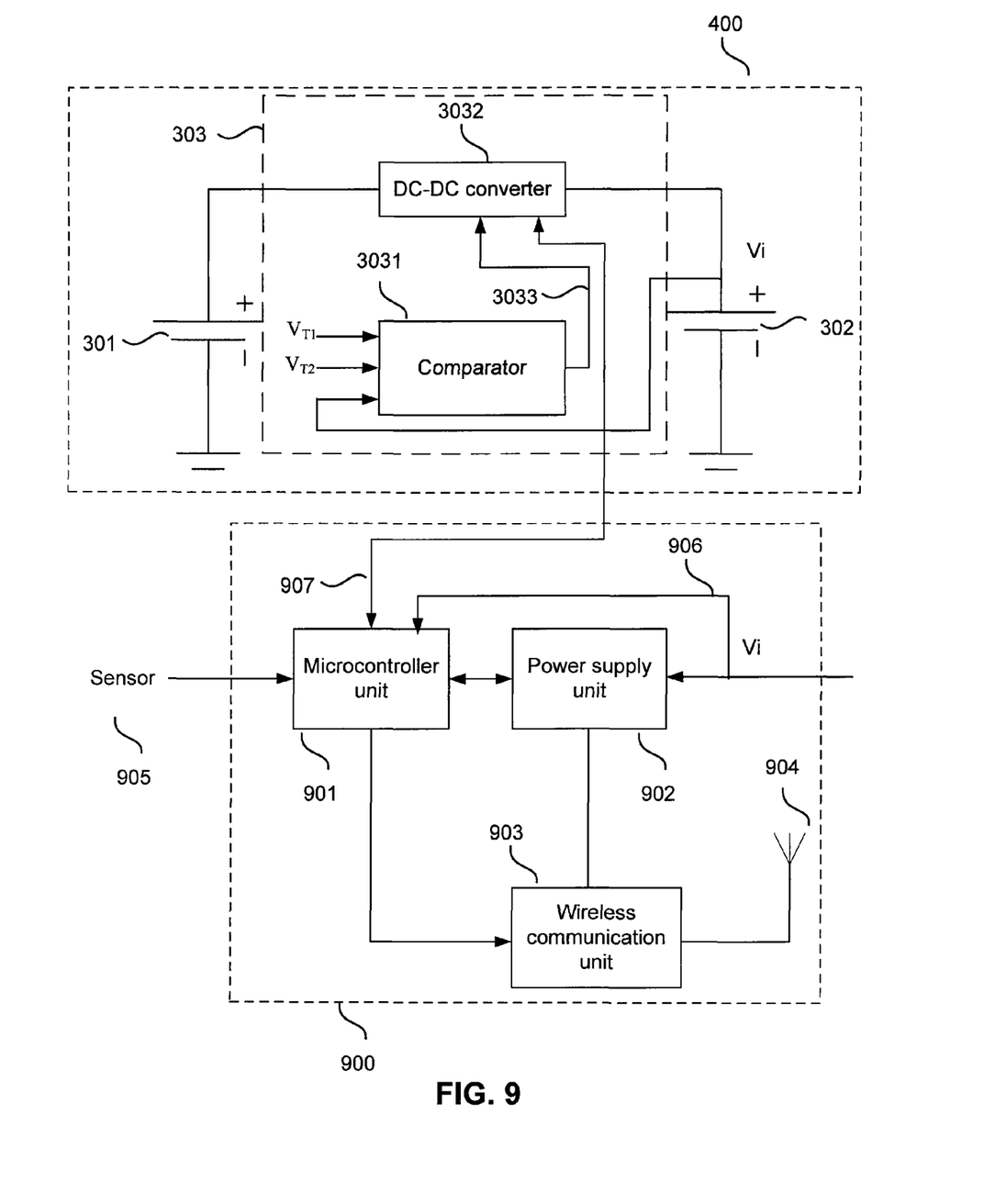
FIG. 9 illustrates a block diagram of an exemplary wireless flow measurement system powered by a power supply system according to one embodiment of the present invention.

FIG. 9 illustrates a block diagram of an exemplary wireless flow measurement system 900 with an exemplary power supply 400 according to one embodiment of the present invention. Similar to the wireless flow measurement system 800 shown in FIG. 8, the wireless flow measurement system 900 may have a microcontroller unit 901, a power supply unit 902, a wireless communication unit 903 and an antenna 904. The microcontroller unit 901 may be coupled to a sensor 905 to receive, e.g., water usage data, and monitor the voltage Vi via 906. The power supply unit 902 may be coupled to the intermediate battery 302, and provide battery power to various parts in the wireless flow measurement system 900 (e.g., the microcontroller unit 901 and the wireless communication unit 903). The wireless communication unit 903 may be configured to send water usage data over a wireless communication network through the antenna 904.

Predicting power remaining in the accumulator battery 301 is key to on-time service and uninterrupted device operation. However, the accumulator battery 301, which may be primary lithium batteries, may have very stable output voltage and the voltage drop of the battery over time is very small and hard to detect. Also, there is no accurate correlation of battery voltage to power remaining in the accumulator battery 301. Thus, the output voltage of the accumulator battery 301 may not be used to calculate its power remaining. Since the charge current from the accumulator battery 301 is constant, charging duration may be used to calculate the amount of current drained from the accumulator battery 301.

One difference between the wireless flow measurement system 900 shown in FIG. 9 and the wireless flow measurement system 800 is that the signal 907 between the microcontroller unit 901 and the charger 303 is a two-way signal. In addition to sending a triggering signal 907 to the charger 303 to trigger the charging of the intermediate battery 302, the microcontroller unit 901 may read the charging time from the charger 303 to calculate the power remaining in the accumulator batter 301.

Figure 10:
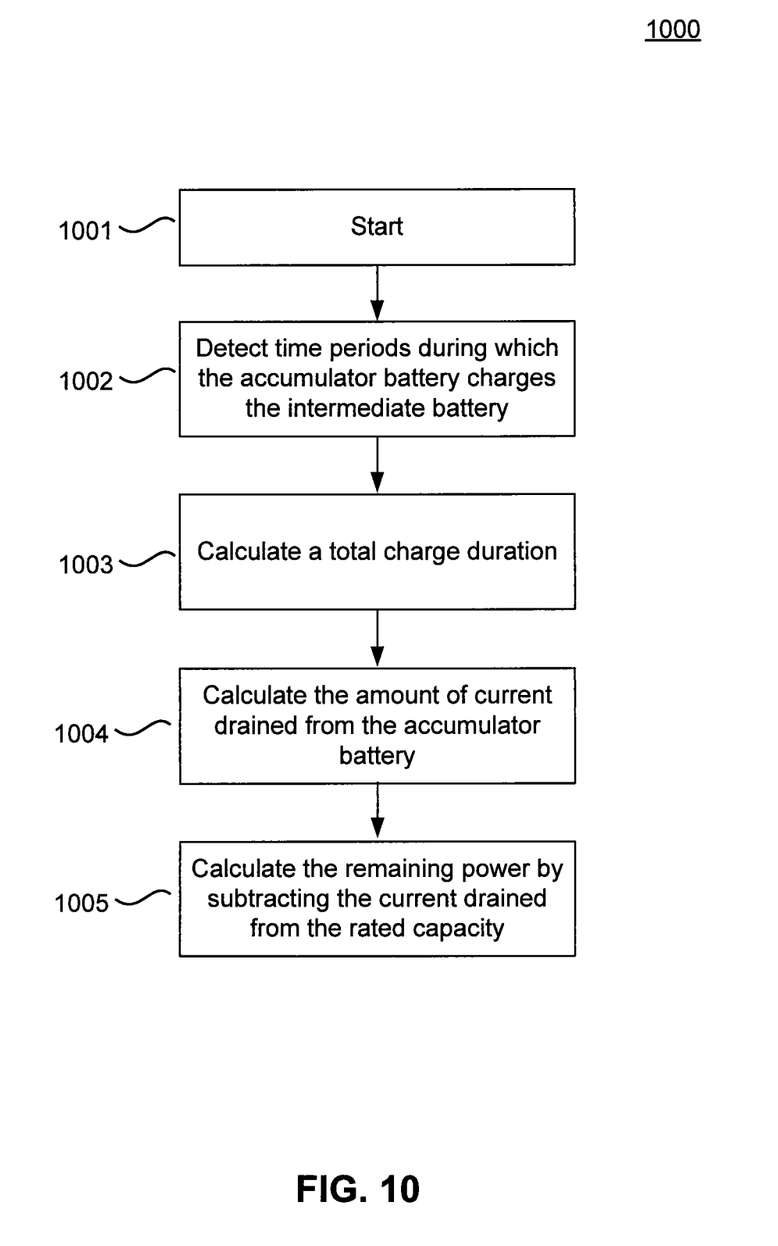
FIG. 10 illustrates a flowchart of a method for determining power remaining in a battery according to one embodiment of the present invention.

FIG. 10 illustrates a flowchart of a method for determining power remaining in the accumulator battery 301 according to one embodiment of the present invention. The process may start at 1001. At 1002, the microcontroller unit 901 may detect time periods during which the accumulator battery 301 charges the intermediate battery 302. In one embodiment, the microcontroller unit 901 may detect the time periods by detecting the time periods during which the DC-DC converter 3032 is enabled or triggered. In the example shown in FIG. 6, the time periods are: t2–t1, t4–43, and t6–t5.

At 1003, the microcontroller unit 901 may calculate a total charging duration by adding the time periods together. In the example shown in FIG. 6, the total charging duration may be calculated as follows:

$$\text{Total charging duration} = (t2-t1)+(t4-t3)+(t6-t5) \quad (1)$$

At 1004, the amount of current drained from the accumulator battery 301 may be calculated by multiplying the charge current with the total charging duration. In the example shown in FIG. 6, the amount of current drained from the accumulator battery 301 may be calculated as follows:

$$\text{Current drained} = \text{charge current} \times \text{total charging duration} \quad (2)$$
$$= 3.5 \text{ mA} \times [(t2-t1) + (t4-t3) + (t6-t5)]$$

At 1005, the power remaining in the accumulator battery 301 may be calculated by subtracting current drained from the accumulator battery 301, calculated according to equation (2), from the rated capacity of the accumulator battery 301.

Several features and aspects of the present invention have been illustrated and described in detail with reference to particular embodiments by way of example only, and not by way of limitation. Alternative implementations and various modifications to the disclosed embodiments are within the scope and contemplation of the present disclosure. Therefore, it is intended that the invention be considered as limited only by the scope of the appended claims.

What is claimed is:

1. A measurement system, comprising:
a control unit which receives usage data of water, electricity or gas from a sensor; a wireless communication unit coupled to the control unit, wherein the wireless communication unit receives the usage data of water, electricity or gas and transmits the usage data of water, electricity or gas via an antenna;
a power supply system that includes
a high energy density electric cell that stores energy and
a rechargeable electric cell that is charged by the high energy density electric cell,
wherein the power output from the power supply system consists only of power output by the rechargeable electric cell; and
a power supply unit coupled to the power supply system, the control unit and the wireless communication unit, wherein the power supply unit provides power from the rechargeable electric cell of the power supply system to the control unit and the wireless communication unit,
wherein the power provided to the wireless communication unit includes high current bursts during the transmission of the usage data of water, electricity or gas via an antenna.

2. The measurement system of claim 1, wherein the power supply system further comprises a charging control device coupled between the high energy density electric cell and the rechargeable electric cell which enables the high energy density electric cell to charge the rechargeable electric cell.

3. The measurement system of claim 2, wherein the high energy density electric cell operates at a current which allows the high energy density electric cell to be in its optimal zone of chemical efficiency.

4. The measurement system of claim 2, wherein the charging control device comprises a comparator for comparing a voltage of the rechargeable electric cell with a first threshold and turning on an enabling signal to enable the high energy density electric cell to charge the rechargeable electric cell when the voltage of the rechargeable electric cell falls below the first threshold.

5. The measurement system of claim 4, wherein the comparator compares the voltage of the rechargeable electric cell with a second threshold, and turns off the enabling signal to stop charging the rechargeable electric cell when the voltage of the rechargeable electric cell reaches the second threshold.

6. The measurement system of claim 4, wherein the charging control device further comprises a voltage regulator coupled between the high energy density electric cell and the rechargeable electric cell that enables the high energy density electric cell to charge the rechargeable electric cell when receiving the enabling signal.

7. The measurement system of claim 6, wherein the voltage regulator is a DC-DC converter.

8. The measurement system of claim 6, wherein the voltage regulator is a low-dropout regulator.

9. The measurement system of claim 1, wherein the high energy density electric cell is a primary lithium battery.

10. The measurement system of claim 1, wherein the rechargeable electric cell is a LiFeSo4 battery, a lithium polymer battery, a nickel-cadmium battery, or a nickel metal hybrid battery.

11. The measurement system of claim 1, wherein the control unit monitors the voltage of the rechargeable electric cell, determines power remaining in the rechargeable electric cell and determines power needed for an upcoming wireless transmission.

12. The measurement system of claim 11, wherein the control unit further determines to turn off the wireless communication unit when the power remaining in the rechargeable electric cell is not enough for the upcoming wireless transmission.

13. The measurement system of claim 12, wherein the control unit further determines to turn on the wireless communication unit when the power remaining in the rechargeable electric cell is enough for the upcoming wireless transmission.

14. The measurement system of claim 11, wherein the control unit turns on a triggering signal to trigger charging of the rechargeable electric cell when the power remaining in the rechargeable electric cell is not enough for the upcoming wireless transmission.

15. The measurement system of claim 14, wherein the control unit turns off the triggering signal, which is used to trigger the charging of the rechargeable electric cell, when the power remaining in the rechargeable electric cell is enough for the upcoming wireless transmission.

16. The measurement system of claim 1, wherein the control unit detects time periods during which the high energy density electric cell charges the rechargeable electric cell, calculates a sum of the time periods, and determines power remaining in the high energy density electric cell based on the sum of the time periods.

17. A power supply system for a measurement system, comprising:
a high energy density electric cell that stores energy;
a rechargeable electric cell that is charged by the high energy density electric cell and provides power to the measurement system and provides high current bursts during a transmission of usage data of water, electricity or gas from the measurement system via an antenna; and
a charging control device coupled between the high energy density electric cell and the rechargeable electric cell wherein the charging control device enables the high energy density electric cell to charge the rechargeable electric cell,
wherein the charging control device controls the high energy density electric cell to operate at a current which allows the high energy density electric cell to be in its optimal zone of chemical efficiency,
wherein power provided to the measurement system consists only of power output by the rechargeable electric cell.

18. A method for powering a measurement system, the method comprising:
comparing a voltage of a rechargeable electric cell with a first threshold, wherein the rechargeable electric cell powers the measurement system and further provides high current bursts to the measurement system during a transmission of usage data of water, electricity or gas from the measurement system via an antenna; and
when the voltage of the rechargeable electric cell is lower than the first threshold, turning on an enabling signal to enable charging of the rechargeable electric cell by a high energy density electric cell which stores energy charging the rechargeable electric cell;
wherein the high energy density electric cell is controlled to operate at a current which allows the high energy density electric cell to be in its optimal zone of chemical efficiency,
wherein power provided to the measurement system consists only of power output by the rechargeable electric cell.

19. The method of claim 18, further comprising:
comparing the voltage of the rechargeable electric cell with a second threshold; and
when the voltage of the rechargeable electric cell exceeds the second threshold, turning off the enabling signal.

20. The method of claim 18, further comprising: receiving a triggering signal from the measurement system when power remaining in the rechargeable electric cell is not enough for an upcoming wireless transmission by a wireless communication unit in the measurement system, and triggering charging of the rechargeable electric cell by the high energy density electric cell.

21. The method of claim 18, wherein the high energy density electric cell is a primary lithium battery.

22. The method of claim 18, wherein the rechargeable electric cell is a LiFeSo4 battery, a lithium polymer battery, a nickel-cadmium battery, or a nickel metal hybrid battery.

23. A method for powering a measurement system, wherein the measurement system comprises a control unit for receiving usage data of water, electricity or gas from an interface, a wireless communication unit for transmitting the usage data, and a power supply unit for providing power to the control unit and the wireless communication unit, the power supply unit comprising a high energy density electric cell and a rechargeable electric cell that is charged by the high energy density electric cell, the method comprising:
comparing a voltage of a rechargeable electric cell with a first threshold, wherein the rechargeable electric cell powers the measurement system and further provides high current bursts to the measurement system during a transmission of usage data or water, electricity or gas from the wireless communication system via an antenna; and
when the voltage of the rechargeable electric cell is lower than the first threshold, turning on an enabling signal to enable charging of the rechargeable electric cell by the high energy density electric cell which stores energy for charging the rechargeable electric cell,
wherein the high energy density electric cell is controlled to operate at a current which allows the high energy density electric cell to be in its optimal zone of chemical efficiency,
wherein power output from the power supply unit consists only of power output by the rechargeable electric cell.

24. The method of claim 23, further comprising: comparing the voltage of the rechargeable electric cell with a second threshold, and turning off the enabling signal when the voltage of the rechargeable electric cell reaches a second threshold.

25. The method of claim 23, wherein the control unit further:
detects the voltage of the rechargeable electric cell;
determines power remaining in the rechargeable electric cell; and
determines power needed for an upcoming wireless transmission from the wireless communication unit.

26. The method of claim 25, wherein the control unit further determines to turn off the wireless communication unit when the power remaining in the rechargeable electric cell is not enough for the upcoming wireless transmission.

27. The method of claim 26, wherein the control unit further determines to turn on the wireless communication unit when the power remaining in the rechargeable electric cell is enough for the upcoming wireless transmission.

28. The method of claim 25, wherein the control unit further turns on a triggering signal to trigger the charging of the rechargeable electric cell when the power remaining in the rechargeable electric cell is not enough for the upcoming wireless transmission.

29. The method of claim 28, wherein the control unit further turns off the triggering signal, which is used to trigger the charging of the rechargeable electric cell, when the power remaining in the rechargeable electric cell is enough for the upcoming wireless transmission.

30. The method of claim 23, wherein the control unit further detects time periods during which the high energy density electric cell charges the rechargeable electric cell.

31. The method of claim 30, wherein the control unit further calculates a total charging duration by adding the time periods.

32. The method of claim 31, wherein the control unit further determines an amount of current drained from the high energy density electric cell.

33. The method of claim 32, wherein the control unit further determines power remaining in the high energy density electric cell by subtracting the amount of current drained from a rated capacity of the high energy density electric cell.

* * * * *